United States Patent
Ban

[19]

[11] Patent Number: 6,001,215
[45] Date of Patent: Dec. 14, 1999

[54] SEMICONDUCTOR NITRIDE FILM ETCHING SYSTEM

[75] Inventor: Cozy Ban, Tokyo, Japan

[73] Assignee: Mitsubishi Denki Kabushiki Kaisha, Tokyo, Japan

[21] Appl. No.: 08/719,372

[22] Filed: Sep. 25, 1996

[30] Foreign Application Priority Data

Apr. 3, 1996 [JP] Japan ................................ 8-081176

[51] Int. Cl.$^6$ ................................ B05D 1/00; B05C 3/00
[52] U.S. Cl. ................................................ 156/345
[58] Field of Search ........................... 156/345; 438/757; 216/93, 99

[56] References Cited

U.S. PATENT DOCUMENTS

| | | | |
|---|---|---|---|
| 3,772,105 | 11/1973 | Shipley | 216/93 |
| 4,092,211 | 5/1978 | Morris . | |
| 4,540,465 | 9/1985 | Coggins et al. | 156/345 |
| 4,865,877 | 9/1989 | Yamaguchi et al. | 427/98 |
| 5,227,010 | 7/1993 | Lubert et al. | 156/345 |
| 5,470,421 | 11/1995 | Nakada et al. | 216/93 |
| 5,472,562 | 12/1995 | Ziger | 438/757 |

FOREIGN PATENT DOCUMENTS

| | | |
|---|---|---|
| 2 321 013 | 11/1974 | Germany . |
| 53-68070 | 6/1978 | Japan . |
| 57-94574 | 6/1982 | Japan . |
| 60-137024 | 7/1985 | Japan . |
| 2-137228 | 5/1990 | Japan . |
| 4-7832 | 1/1992 | Japan . |
| 6-224176 | 8/1994 | Japan . |
| 6-349808 | 12/1994 | Japan . |
| 7-86260 | 3/1995 | Japan . |
| 8-83792 | 3/1996 | Japan . |

OTHER PUBLICATIONS

Patent Abstracts of Japan, JP 07–230981, Aug. 29, 1995.
Patent Abstracts of Japan, vol. 16, No. 472 (E–1272), Sep. 30, 1992, JP 4–170029, Jun. 17, 1992.
Patent Abstracts of Japan, vol. 14, No. 374 (E–964), Aug. 13, 1990, JP 2–137228, May 25, 1990.
Patent Abstacts of Japan, vol. 12, No. 168 (E–611), May 20, 1988, JP 62–281335, Dec. 7, 1987.

*Primary Examiner*—Thi Dang
*Attorney, Agent, or Firm*—Oblon, Spivak, McClelland, Maier & Neustadt, P.C.

[57] ABSTRACT

Semiconductor nitride film etching systems are provided using a hot phosphoric-acid-based treatment solution, wherein the systems contain means for measuring phosphoric acid concentration, silicon concentration, fluorine concentration, or specific gravity or a combination thereof, and additives of the treatment solution are controlled or the treatment solution is exchanged. The concentration of components of the treatment solution, particularly the concentration of silicon, is controlled, thus providing stabilization of the etching rate of a silicon nitride film, and stable control of the etching selection ratio.

15 Claims, 15 Drawing Sheets

SEMICONDUCTOR NITRIDE FILM ETCHING SYSTEM

BACKGROUND OF THE INVENTION

1. Field of the Invention

The present invention relates to a semiconductor nitride film etching system for stabilizing a nitride film etching rate of a semiconductor wafer and an etching selection ratio.

2. Discussion of the Background

Semiconductor nitride films with various properties can be formed by various methods at present, and therefore various applications in semiconductor manufacturing are increased. As the integration level of a semiconductor device rises, the structure of the device is further complicated, and types of coexistent films depend on the process to which the films are applied.

In general, nitride film etching has used wet treatment and a treatment solution containing hot phosphoric acid so far. However, as the integration level of a device rises and the structure of the device is further complicated, nitride films and oxide nitride films with various properties are used. Therefore, it is difficult to etch these films of the nitride-film system by the conventional hot phosphoric acid treatment with high controllability. [0003]

In a semiconductor manufacturing process, because the sectional form and the cleanliness of an integrated circuit after etching are important, it is very important to control the etching selection ratio between a nitride film to be etched and other coexistent films (e.g. SiOxNy-based film: $0 \leq x$, $y \leq 2$). The etching selection ratio is determined by an equilibrium reaction relating to etching, and hence, an etchant, reaction product, and temperature serve as parameters of the reaction rate of the equilibrium reaction. Therefore, to realize accurate etching, it is indispensable to control these parameters.

FIG. 21 shows a configuration of a conventional circulation-type nitride film etching system. The conventional etching system is constituted so as to circulate the treatment solution through a treatment tank 1, while passing the solution through a filter 3 by a pump 2, and heating the solution by a heater 4, and supplying demineralized water by a demineralized-water dripping apparatus 5. This type of etching system is constituted so as to control the concentration and temperature of only phosphoric acid in the treatment solution, but it cannot control other components in the treatment solution.

Therefore, it is difficult to optionally and stably obtain the etching rates of a nitride film and other films, and the selection ratio between the nitride film and other films.

The present invention is made to solve the above problems and its object is to provide a semiconductor nitride film etching system for improving treatment solution performance and stabilizing the etching rate of a semiconductor nitride film and the etching selection ratio.

SUMMARY OF THE INVENTION

According to one aspect of the invention, a semiconductor nitride film etching system is provided, comprising means for adding ammonium fluoride or buffered hydrofluoric acid to a treatment solution mainly containing heated phosphoric acid.

In another aspect of the invention, in the semiconductor nitride film etching system, means for detecting the fluorine concentration in the treatment solution is included so as to adjust said fluorine concentration by controlling the amount of fluorine to be added.

In another aspect of the invention, in the semiconductor nitride film etching system, the fluorine concentration in the treatment solution is controlled to be 200 ppm or less.

According to another aspect of the invention, a semiconductor nitride film etching system is provided, comprising means for adding silicon or a silicon compound to the treatment solution mainly containing phosphoric acid.

In another aspect of the invention, in the semiconductor nitride film etching system, means for detecting the silicon concentration in the treatment solution is included so as to adjust said silicon concentration by controlling the amount of silicon to be added.

In another aspect of the invention, in the semiconductor nitride film etching system, means for adding fluorine to the treatment solution is included so as to adjust the silicon concentration in said treatment solution by controlling the amount of fluorine to be added.

In another aspect of the invention, in the semiconductor nitride film etching system, means for adding fluorine to the treatment solution is included so as to adjust the silicon concentration in said treatment solution to a certain rate of the saturated silicon concentration at the temperature of said treatment solution.

According to another aspect of the invention, a semiconductor nitride film etching system is provided comprising means for cooling and discharging a treatment solution mainly containing phosphoric acid from a treatment tank and means for injecting new phosphoric acid solution into said tank so as to adjust the components of said treatment solution in said tank.

In another aspect of the invention, in the semiconductor nitride film etching system, the silicon concentration in the treatment solution in a treatment tank is adjusted by injecting new phosphoric acid solution containing silicon.

In another aspect of the invention, in the semiconductor nitride film etching system, a heat exchanger is included for heat-exchanging phosphoric-acid treatment solution to be discharged with phosphoric acid solution to be injected.

According to another aspect of the invention, a semiconductor nitride film etching system is provided, comprising a plurality of treatment tanks storing a treatment solution mainly containing phosphoric acid and also containing silicon so as to adjust the silicon concentration in said treatment solution stored in said treatment tanks by transferring said treatment solution between said treatment tanks.

In another aspect of the invention, in the semiconductor nitride film etching system, control means for calculating the silicon concentration in the treatment solution in the treatment tanks and controlling the transfer of said treatment solution between said treatment tanks is included.

In another aspect of the invention, in the semiconductor nitride film etching system, means for measuring the specific gravity of the treatment solution is included so as to adjust the specific gravity of said treatment solution by adding water.

In another aspect of the invention, in the semiconductor nitride film etching system, a treatment tank and a chemical-solution contact portion of a chemical-solution circulation channel are made of a material from which no silicon dissolves.

Still in another aspect of the invention, the features of the present invention as stated above are combined with each other. Other features and advantages of the present invention will become more apparent from the following description taken together with the accompanying drawings.

DETAILED DESCRIPTION OF THE PREFERRED EMBODIMENTS

This invention will be described in further detail by way of example with reference to the accompanying drawings.

First Embodiment

Figure 1:
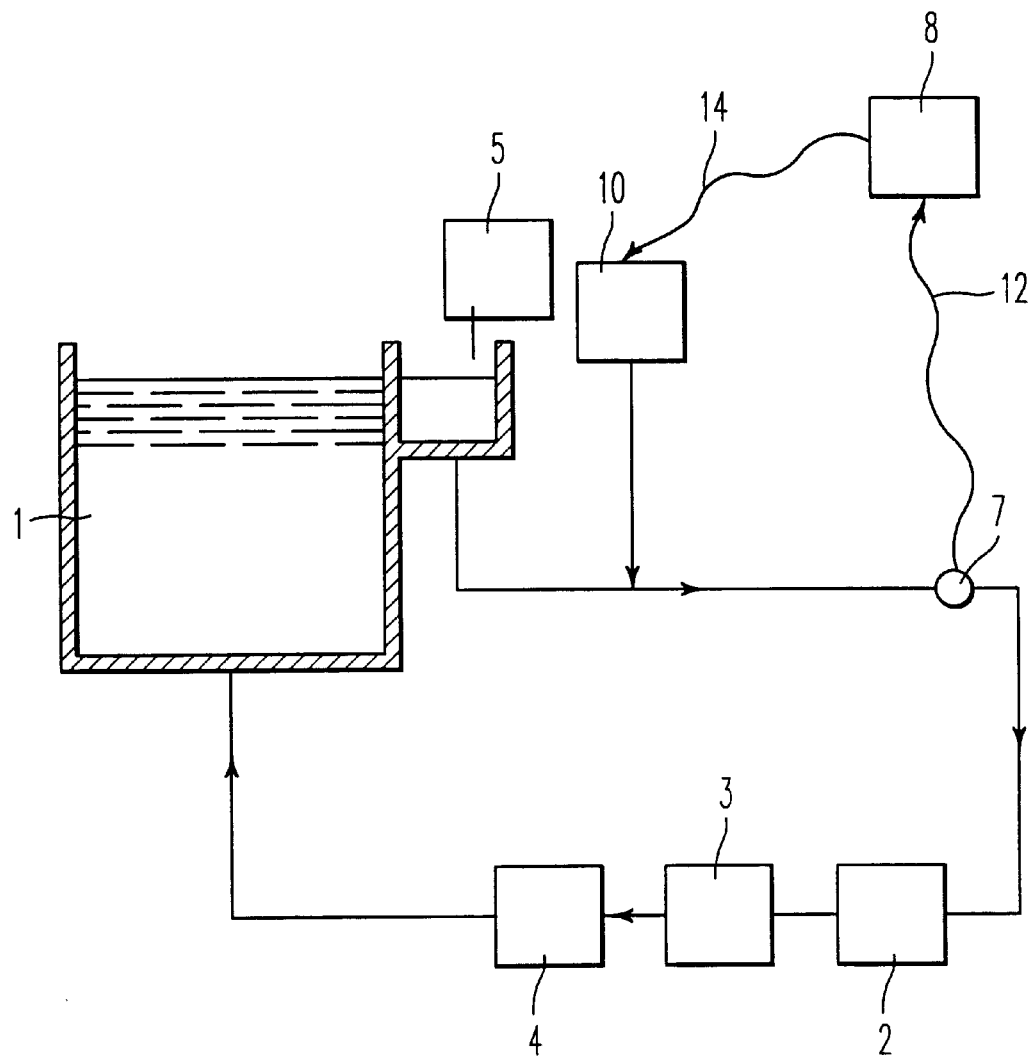
FIG. 1 is an illustration showing the configuration of the nitride film etching system (wet treatment system) according to the first embodiment of the present invention.

The first embodiment of the present invention is described below which stresses selection of the treatment solution and adjustment of the fluorine concentration in the treatment solution. FIG. 1 illustrates a configuration of the etching system (wet treatment system) according to the first embodiment of the present invention for etching a semiconductor nitride film. As shown in FIG. 1, the wet treatment system comprises a treatment tank 1 and a pump 2 for circulating the treatment solution through the treatment tank 1. A circulation channel of the treatment solution is provided with a filter 3 for removing impurities from the treatment solution, a heater 4 for returning the temperature of the treatment solution to a treatment temperature, and a demineralized-water dripping apparatus 5 for replenishing water to be evaporated.

The wet treatment system further comprises an F concentration monitor (fluorine concentration monitor) 7 for sensing the F concentration (fluorine concentration) in the treatment solution so as to control an F injector (fluorine injector) 10 for increasing the F concentration in the treatment solution. The information in the F concentration monitor 7 is transferred to an injection control system 8 through a signal line 12. The injection control system 8 controls the F injector 10 by a signal line 14.

The wet treatment system uses phosphoric acid as the primary component of the treatment solution, heats the treatment solution by the heater 4 to keep the treatment solution at a constant temperature, and keeps the phosphoric acid concentration constant while replenishing water to be evaporated by the demineralized-water dripping apparatus 5. Moreover, the wet treatment system constantly circulates the treatment solution by the pump 2 to accelerate agitation effects.

The treatment solution to be added to phosphoric acid in the present invention is described below. According to experiments by the present inventor, it is difficult to maintain the state in which Si compounds are completely removed from phosphoric acid solution. It is more important to keep the F concentration more stable than to completely remove the Si compounds.

By adding ammonium fluoride ($NH_4F$) or buffered hydrofluoric acid (BHF) containing hydrogen fluoride (HF) and ammonium fluoride ($NH_4F$) to phosphoric acid solution, the following reaction formula is effected as an equilibrium reaction.

$$NH_4F + HF \longleftrightarrow NH_4 + HF_2^-$$

Therefore, it is possible to keep stable the concentration of $HF_2^-$ serving as the etchant of $SiO_2$ in phosphoric acid by adding BHF containing $NH_4F$ and HF instead of adding hydrofluoric acid. Moreover, because the concentration of $HF_2^-$ serving as an etchant can be controlled more accurately, addition of ammonium fluoride ($NH_4F$) or buffered hydrofluoric acid (BHF) containing HF and $NH_4F$ is indispensable for adjustment of the F concentration of the present invention.

Silicon serves as a substrate constituting an integrated circuit. Etching of silicon advances along the boundary between silicon grains and the roughness increases because grains are actualized. Increase of the roughness has caused the problem that device characteristics are deteriorated because leak current easily increases and break down voltage lowers.

A case is known in which a mixture of phosphoric acid, hydrofluoric acid, and nitric acid is used for etching of silicon or a silicon nitride film. However, the present inventor found that the silicon etching rate can be controlled to 1 Å/min. or less by removing nitric acid components and thereby decreasing the etching rate. As a result, no growth of roughness is observed or no characteristics are deteriorated.

Thus, in the case of the present invention, the F concentration in the treatment solution is sensed by the F concentration monitor 7, the injection control system 8 is operated in accordance with a signal of the monitor, and ammonium fluoride ($NH_4F$) or buffered hydrofluoric acid (BHF) containing hydrogen fluoride (HF) and ammonium fluoride ($NH_4F$) is added from the F injection apparatus 10 to control the F concentration. Thereby, it is possible to stabilize the nitride film etching rate.

The significance of control of the concentration of fluorine or ammonium fluoride in mixed phosphoric acid, that is, the F concentration in the case of the present invention, is described below. As a specific application example, the significance of controlling F concentration to 200 ppm or less in the etching of a plasma silicon nitride film (Plasma SiN) is described below.

Figure 2:
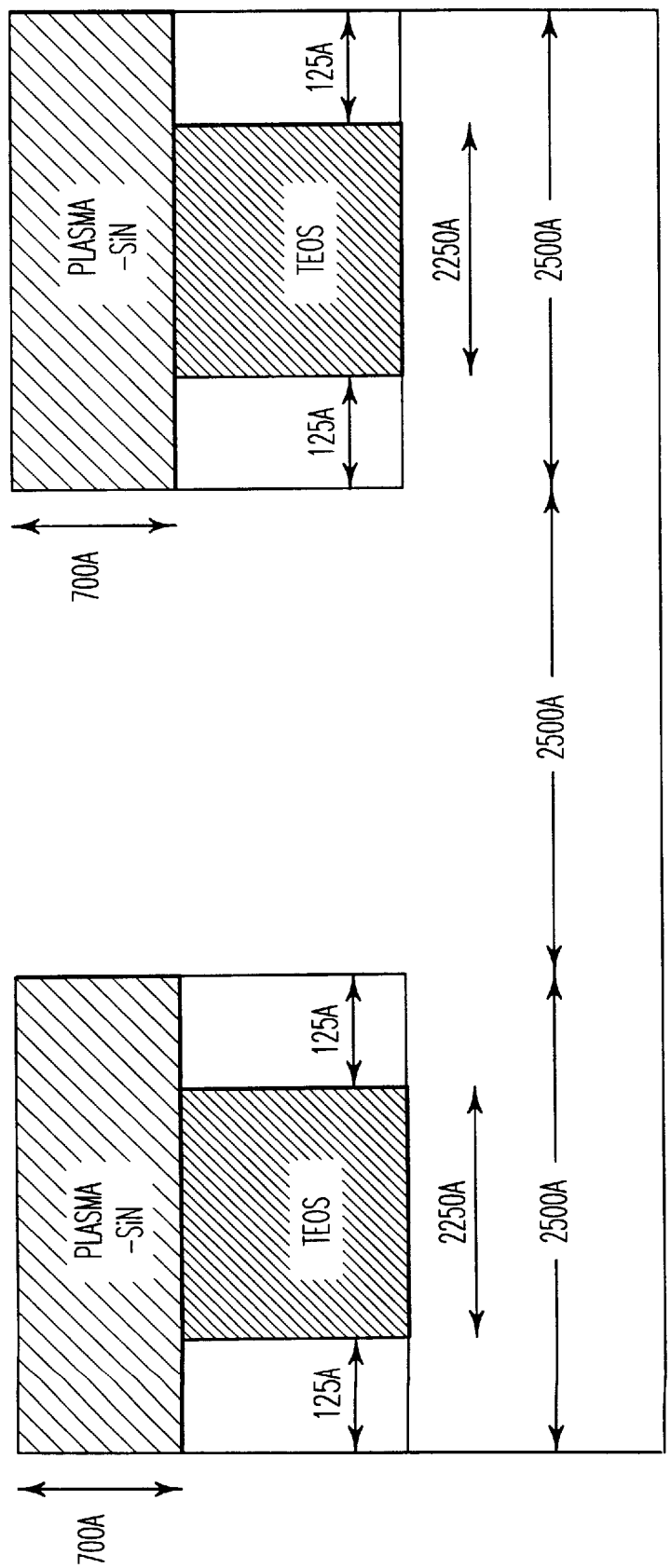
FIG. 2 is an illustration of the cross sectional shape of a device depicting a case of etching a nitride film by the first embodiment of the present invention.

FIG. 2 shows a structure in which a nitride film formed by plasma (Plasma SiN) is etched. This is a case in which a nitride film formed by plasma (Plasma SiN) to be used as an ARC film (Anti-Reflect Coating: antireflection film) of a semiconductor device of 0.25 µm rule, which is an advanced device such as a 256 MDRAM, is etched and removed.

In the 256 MDRAM manufacturing process, as shown in FIG. 2, a TEOS oxide film is formed on a silicon substrate, and then, Plasma SiN serving as an ARC film is formed on the TEOS oxide film. Further, resist is applied to the wafer and exposed to form a hole with a diameter of 0.25 µm (2,500 Å) on the TEOS oxide film. After the resist is removed, the device has the structure shown in FIG. 2.

Figure 3:
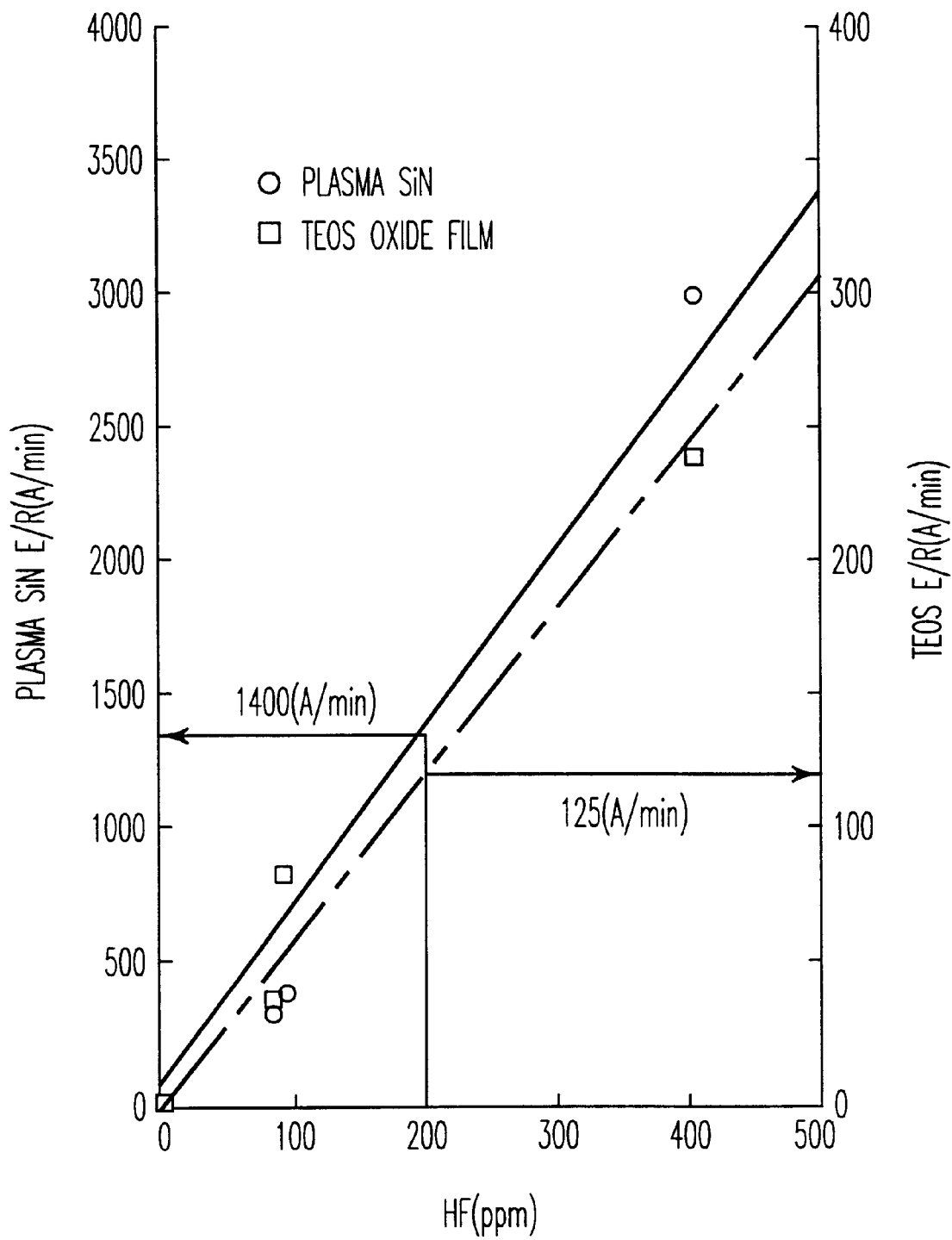
FIG. 3 is an illustration showing the relation between etching rates of a plasma silicon nitride film (Plasma SiN) and an oxide film (TEOS gas) on one hand and F concentration in a phosphoric acid system on the other hand.

In the above process, the Plasma SiN is generally etched and removed by phosphoric acid containing fluorine. The etching time requires 30 sec. or more from the viewpoint of etching uniformity and controllability. FIG. 3 shows the relation between the etching rates of Plasma SiN and an oxide film (formed by TEOS gas) and the concentration of F contained in a phosphoric acid system in the etching treatment using a phosphoric acid including fluorine.

The structure shown in FIG. 2 is general for a 0.25 µm-rule device and a film thickness of Plasma SiN of approx. 700 Å is selected from the viewpoint of an absorption coefficient depending on an exposure wavelength. To remove the film with a thickness of 700 Å for 30 sec. or more, it is found from the experiment results shown in FIG. 3 that the etching rate must be 1,400 Å or less for 1 min. and the F concentration must be 200 ppm or less. During the etching process of the Plasma SiN film, the TEOS oxide film is side-etched from the lateral direction. From the experiment results in FIG. 3, it is found that the etching depth is 125 Å/min. from both sides respectively, and the diameter expands by 250 Å per min. The tolerance to form a hole with a diameter of 2,500 Å is 10% of the diameter, that is, 2,500±250 Å. When the F concentration is higher than 200 ppm, the oxide film is further etched up to 250 Å or more exceeding 250 Å. Therefore, it is impossible to satisfy the specification of a hole with a diameter necessary for a 0.25 µm-rule device. When the F concentration is 200 ppm or lower, the above problem is solved because the etching condition of the Plasma SiN film (700 Å for 30 sec. or more) and that of the TEOS film (250 Å or less) are satisfied by performing the etching between 30 sec. and 1 min.

Second Embodiment

Figure 4:
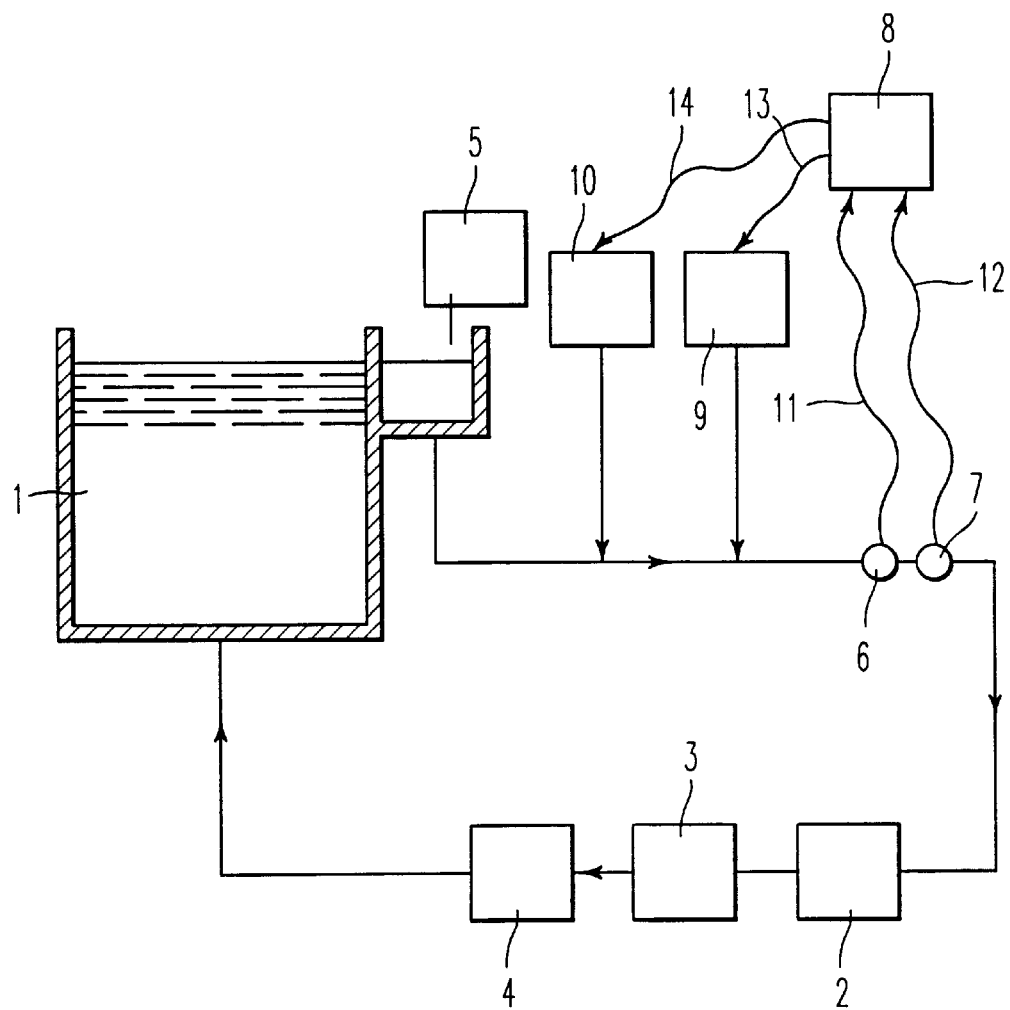
FIG. 4 is an illustration showing the configuration of the nitride film etching system (wet treatment system) according to the second embodiment of the present invention.

The second embodiment of the present invention is described below, which stresses adjustment of the silicon concentration in treatment solution. FIG. 4 illustrates a configuration of the etching system (wet treatment system) according to a second embodiment of the present invention. As shown in FIG. 4, the wet treatment system comprises a treatment tank 1 and a pump 2 for circulating the treatment solution through the treatment tank 1. The circulation channel of the treatment solution is provided with a filter 3 for removing impurities from the treatment solution, a heater 4 for returning the temperature of the treatment solution to the treatment temperature, and a demineralized-water dripping apparatus 5 for replenishing water to be evaporated.

Further, the wet treatment system is provided with an Si concentration monitor 6 for sensing the Si concentration (silicon concentration) in the treatment solution and an F concentration monitor 7 for sensing the F concentration in the treatment solution. An injection control system 8 is operated in accordance with signals of these monitors so as to control a Si injector 9 for increasing the Si concentration in the treatment solution and an F injector 10 for increasing the F concentration in the treatment solution. The information in the Si concentration monitor 6 is transferred to the injection control system 8 through a signal line 11, and the information in the F concentration monitor 7 is transferred to the injection control system 8 through a signal line 12. The injection control system 8 controls the injector 9 through a signal line 13 and the F injector 10 through a signal line 14.

The wet treatment system uses phosphoric acid as the main component of the treatment solution, heats the treatment solution by the heater 4 to keep the treatment solution of a constant temperature, and keeps the phosphoric acid concentration constant while replenishing water to be evaporated by the demineralized-water dripping apparatus 5. Moreover, the wet treatment system constantly circulates the treatment solution by the pump 2 to accelerate agitation effects.

Figure 5:
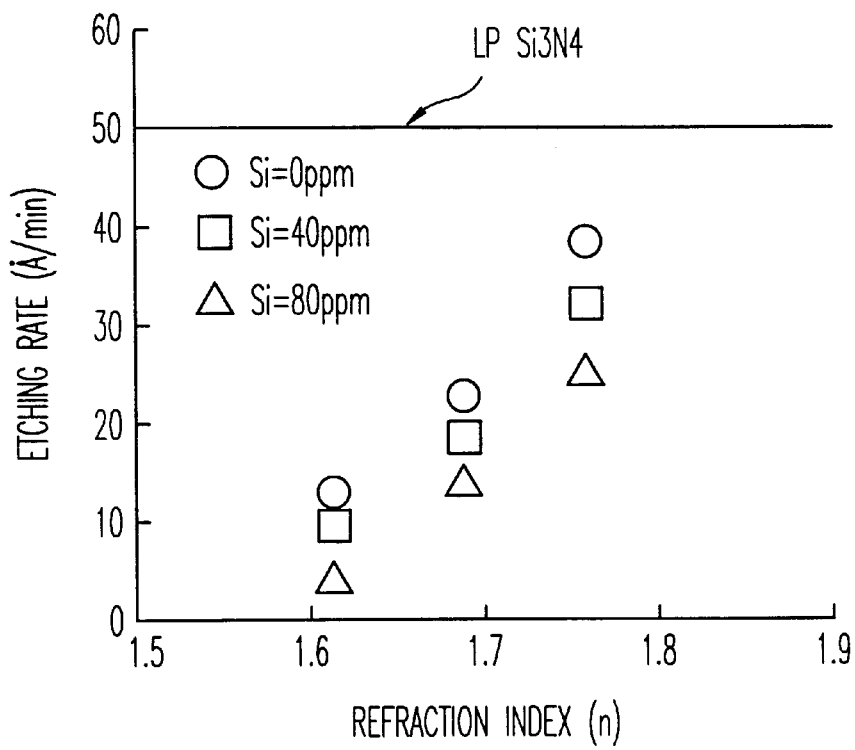
FIG. 5 is an illustration showing etching rates of SiON films with different refraction factors to hot phosphoric acid.

In the case of the present invention, the meaning of Si addition is first explained. When element separation by an oxide film of a silicon device is performed, a process for forming a very thin oxide nitride film with a thickness of approx. 10 nm under a nitride film may be used. In this case, because the nitride film is frequently etched by a hot phosphoric-acid-based treatment solution, it is necessary to avoid that the hot phosphoric-acid-based treatment solution contacts a silicon substrate to affect the substrate. When the etching rate of the oxide nitride film is larger than that of the nitride film, the oxide nitride film is removed immediately after the nitride film is removed. Therefore, a larger selection ratio between these two films is better. FIG. 5 shows etching rates of SiON films with different refraction indexes to heated phosphoric acid. As shown in FIG. 5, the etching rate of an oxide nitride film tends to decrease as the silicon concentration increases, but the etching rate of a nitride film does not change. That is, a high selection rate can be obtained by keeping the silicon concentration at a high value.

Figure 6:
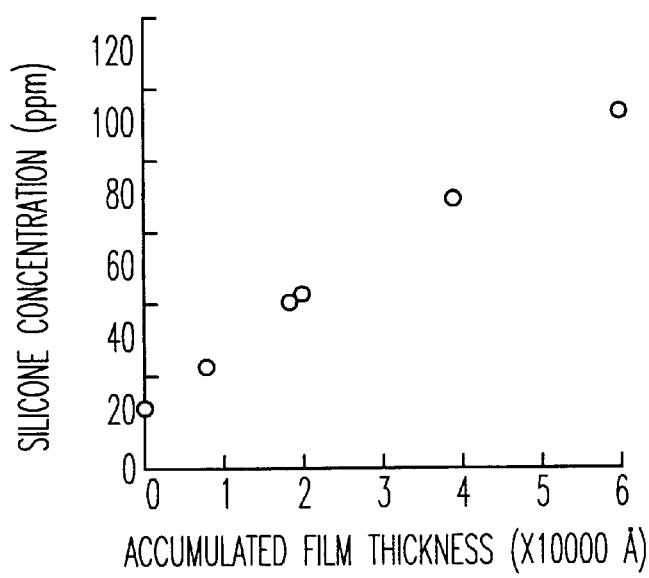
FIG. 6 is an illustration showing the relation between accumulated treated film thickness of a nitride film and Si concentration in a phosphoric acid system.
Figure 7:
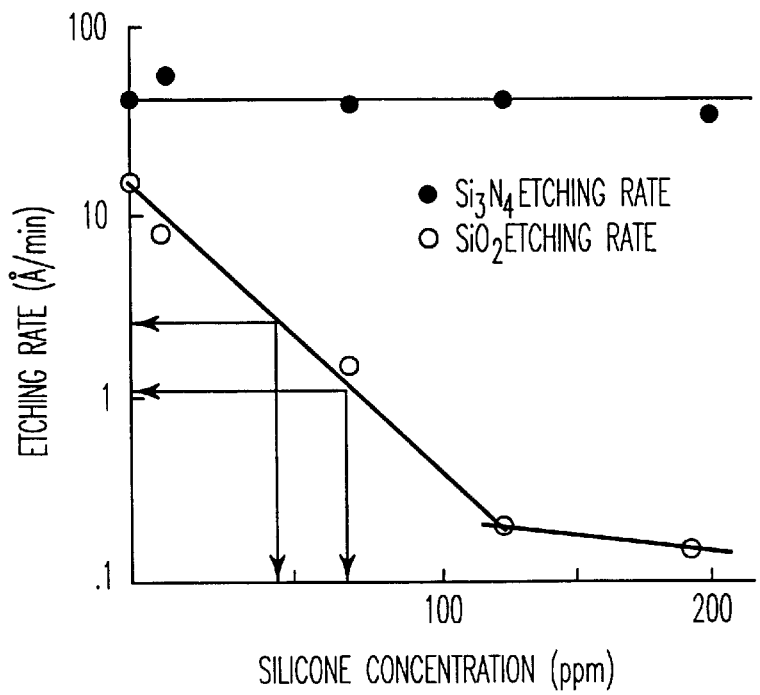
FIG. 7 is an illustration showing the relation between Si concentration in a phosphoric acid system and etching rates of $Si_3N_4$ and $SiO_2$.

The significance of injection of Si into phosphoric acid solution and adjustment of Si concentration, and the significance of injection of F into the phosphoric acid solution and adjustment of F concentration and Si concentration in the present invention are described below. In the case of the system shown in FIG. 4, by performing etching in the treatment tank 1, the Si component dissolves and the Si concentration in the treatment solution increases. This state is shown in FIG. 6. As shown in FIG. 6, the saturated silicon concentration increases as the dissolved accumulated film thickness increases. The Si influences the etching rate of an SiOxNy-based films such as an $SiO_2$ film, LP-SiON film, Plasma-SiON film, Plasma-SiN, or N doped Poly Si and fluctuates the rate 100 times or more according to circumstances. This is shown in FIG. 7. From FIG. 7, it is found that the etching rate of $Si_3N_4$ hardly changes for the change of the silicon concentration, but the etching rate of $SiO_2$ extremely decreases.

The conventional methods are not provided with means for taking produced Si-based impurities to the outside of the system. Therefore, as shown in FIG. 7, when the etching rate fluctuates during treatment, etching for a desired film thickness is not completed in a predetermined time according to circumstances, and thereby, a residual film is produced.

As the result of evaluation by the present inventor, it has been found that reactions progressing in phosphoric acid solution can be arranged as shown below.

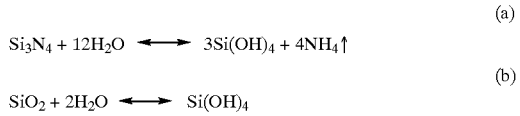

As shown by the above formulas (a) and (b), a film containing Si is etched by using $H_2O$ as an etchant, and etched Si is accumulated in the treatment solution in the form of a hydrate. When the amount of accumulated Si increases in the reaction system, leftward reactions are progressed in the formulas (a) and (b), particularly in the formula (b) and $SiO_2$ remains as a residual film.

The wet treatment system of the second embodiment of the present invention is constituted so that a treatment solution containing F (fluorine) can be injected into circulating treatment solution. Reaction formulas when F is injected are shown below. When F ions are added, the following reactions occur.

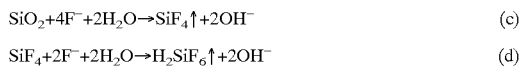

Thereby, Si which impedes etching is removed from impurities in the Si system in the form of $H_2SiF_6$. At the same time, F ions restrain a residual film from being produced because they etch an $SiO_2$-based film and accelerate removal. It is considered that discharge from the system is performed in the form of $SiF_4$ gas as shown in the formula (c) and in the form of an azeotrope of $H_2O$ with $H_2SiF_6$ as shown in the formula (d).

As shown here, impurities in the $SiO_2$ system are removed from the system by adding F. However, this embodiment further makes it possible to detect the Si concentration in the phosphoric acid solution by the Si concentration monitor 6 and the F concentration in the solution by the F concentration monitor 7, and inject a calculated necessary amount of Si and/or F with the Si injector 9 and/or the F injector 10 by using the injection control system 8.

Because the conventional method is not provided with means for discharging Si from the system, it is impossible to positively remove impurities and thereby, the performance of the treatment solution is deteriorated as time passes. However, the second embodiment of the present invention makes it possible to stabilize the treatment solution performance and use the treatment solution for a long time by adding a mechanism for discharging Si from the system.

Figure 8:
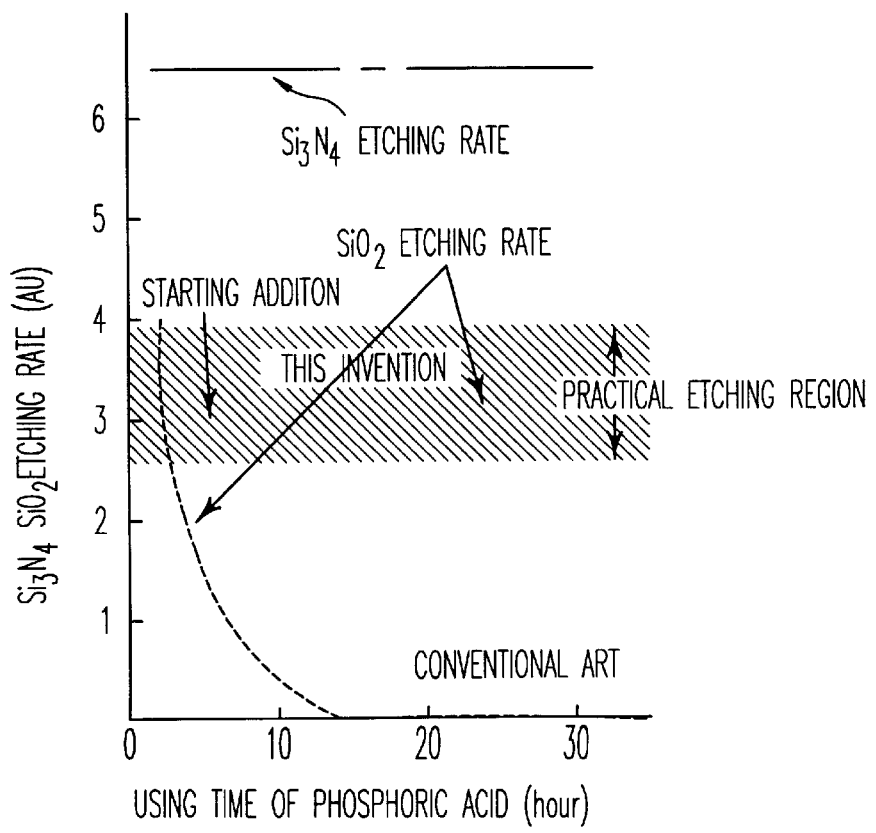
FIG. 8 is an illustration showing the relation between phosphoric acid using time and etching rates of $Si_3N_4$ and $SiO_2$.

The result of applying the present invention to an actual etching system is described below. As explained about FIG. 7, the etching rate of $SiO_2$ decreases when the silicon concentration increases. However, the system of this embodiment stabilizes the etching rates of $Si_3N_4$ and $SiO_2$ by adding F and keeping the Si concentration constant. LP-$Si_3N_4$ and $SiO_2$ as a representative of SioxNy-based films are selected and this embodiment is applied to LP-$Si_3N_4$ and $SiO_2$. The result is shown in FIG. 8. Thus, because it is possible to keep the etching rates of LP-$Si_3N_4$ and $SiO_2$ constant, the shape of a device is also kept constant.

Figure 9:
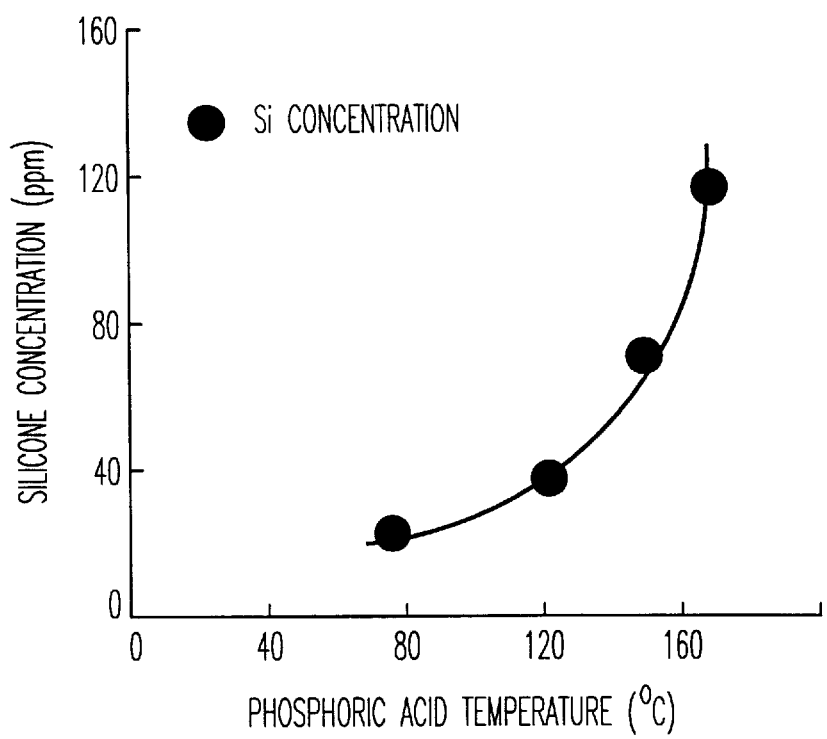
FIG. 9 is an illustration showing the relation between phosphoric acid temperature and saturated Si concentration.

The significance of adjusting an Si concentration on the basis of the Si saturation concentration corresponding to phosphoric acid solution temperature is described below by further progressing the adjustment of the Si concentration. At present, the phosphoric acid treatment temperature changes in accordance with the diversification of film qualities and various treatment temperatures from 100 to 200° C. are applied. The Si saturation concentration changes in accordance with the temperature of phosphoric acid serving as a solvent. Experiment results of the above mentioned are shown in FIG. 9. According to the experiment results, as shown in FIG. 9, only 40 ppm of silicon dissolves in phosphoric acid at 120° C. By treating an $Si_3N_4$ film under the above state, a high selection ratio may be kept for $SiO_2$. However, it is found that the $Si_3N_4$ film cannot practically be used because a supersaturation state occurs and the system encounters trouble when a filter clogs or the process encounters trouble because residue remains on a wafer.

To solve the above problem, the present inventor found that it is important to control the Si concentration to a specific rate of the Si saturation concentration unequivocally determined by phosphoric acid temperature on the basis of the Si saturation concentration. By using this method, it is possible to keep the selection ratio in an optimal constant range.

Figure 10:
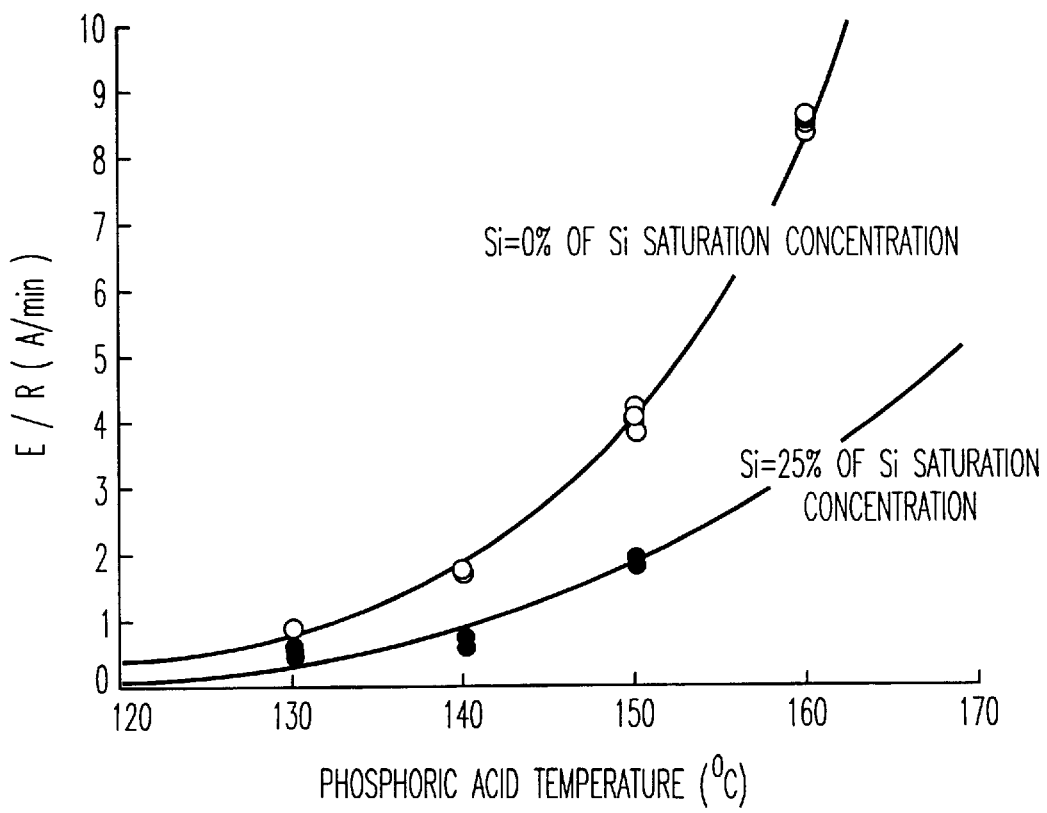
FIG. 10 is an illustration showing the etching rate of an SiON film (R.I.=1.590) at each temperature when setting the Si concentration in phosphoric acid to 0% and 25% of the saturated Si concentration at each phosphoric acid temperature.

In the case of the nitride film etching system containing only phosphoric acid when the F concentration is 0 ppb, as shown in FIG. 10, it is necessary to set the phosphoric acid temperature to 150° C. or lower in order to keep the etching rate of Plasma SiN at 200 Å/min., considered as a high-controllability level in a process, or lower. The Si saturation concentration at 150° C. is 75 ppm. To realize a selection ratio of 100 or more in this process, it is necessary that the etching rate of an SiON film, to be simultaneously etched, is 2 Å/min. or less. This condition is satisfied at 19 ppm or higher which corresponds to 25% or more of the Si saturation concentration.

There is a positive correlation between phosphoric acid temperature and Si saturation concentration. Moreover, the etching rate of each film is a function of Si concentration and it can be standardized in accordance with what percentage of the saturation concentration the Si concentration is. This is shown in FIG. 10. Therefore, the present inventor concluded that the selection ratio can be controlled by controlling how much Si is already dissolved or how much Si can be dissolved by preparing it at the saturation concentration at the treatment temperature. In the above description, a case is described in which the F concentration is 0 ppb. However, it is confirmed that the same trend is shown even if F is contained in phosphoric acid.

The treatment solution used for the present invention is described below. In the case of the present invention, it is important to adjust the F concentration in phosphoric acid and the Si concentration to a predetermined rate of the Si saturation concentration at the then phosphoric acid temperature. According to experiments by the present inventor, it is difficult to maintain the state in which Si compounds are completely removed from phosphoric acid, and it is necessary that the F concentration and Si concentration are more stable from the viewpoint of adjustment of the F concentration and of adjustment of the Si concentration to the desired percentage of the Si saturation concentration at a given phosphoric acid temperature.

In the case of ammonium fluoride ($NH_4F$) and buffered hydrofluoric acid (BHF) containing HF and $NH_4F$, the following reaction formula is effected as an equilibrium reaction.

$$NH_4F + HF \longleftrightarrow HN_4 + HF_2^-$$

Therefore, by adding $NH_4F$ or BHF containing HF and $NH_4F$ instead of adding hydrofluoric acid, it is possible to keep the $HF_2^-$ concentration serving as the etchant of $SiO_2$ in phosphoric acid more stable. Moreover, because the $HF_2^-$ concentration can be controlled more accurately, addition of $NH_4F$ or BHF is effective for adjustment of the F concentration.

In the present embodiment for adjusting the concentration of silicon contained in the treatment solution mainly containing hot phosphoric acid, the treatment solution is not restricted to solutions containing only ammonium.fluoride or buffered hydrofluoric acid in phosphoric acid solution. The treatment solution can use not only hot phosphoric acid alone but also a solution obtained by adding hydrofluoric acid to hot phosphoric acid. The present invention uses a wet treatment system of the above hot phosphoric acid system to add silicon or a silicon compound or control the concentration of the silicon or silicon compound. Though it is possible to add silicon in the form of granular $SiO_2$, powdered $SiO_2$, or $SiO_2$ dissolved in demineralized water, it is preferable to add silicon in the form of colloidal silicon because the colloidal silicon easily reacts on other substances.

It is described below that simple control of the Si concentration by injection of F can also be made by the system previously shown in FIG. 1. The wet treatment system of the second embodiment shown in FIG. 4 adds F ions in accordance with the concentration of Si-based impurities. However, the wet treatment system of the first embodiment shown in FIG. 1 narrows down its functions to detection and addition of F ions. Even if the system is simplified like the above mentioned, it may be possible to completely keep the etching selection ratio between a nitride film serving as a film to be etched and another coexistent film (e.g. SioxNy-based film: $0 \leq x$, $y \leq 2$) in a certain range. For example, this is a case in which the Si that dissolves from a lot to be treated is constant over every lot and the amount of Si in a system can be estimated. In this case, it is possible to keep the selection ratio constant only by addition of F ions and moreover simplify the system.

It is described below that a high or low selection ratio can be selected in the system in FIG. 4 by setting the Si concentration to a high or low value in accordance with the type of material to be treated. For example, the silicon concentration is set to a specific range of a low concentration of 50% or less and one lot is treated at a low selection ratio. When the silicon concentration of the treatment solution increases, it is set to a specific range of 50% or more and different lots are treated at a high selection ratio. Thus, one treatment tank can be used for various purposes. Moreover, by using a plurality of treatment tanks or etching systems and setting different silicon concentrations, it is possible to perform parallel treatments. This is further described later.

Figure 11:
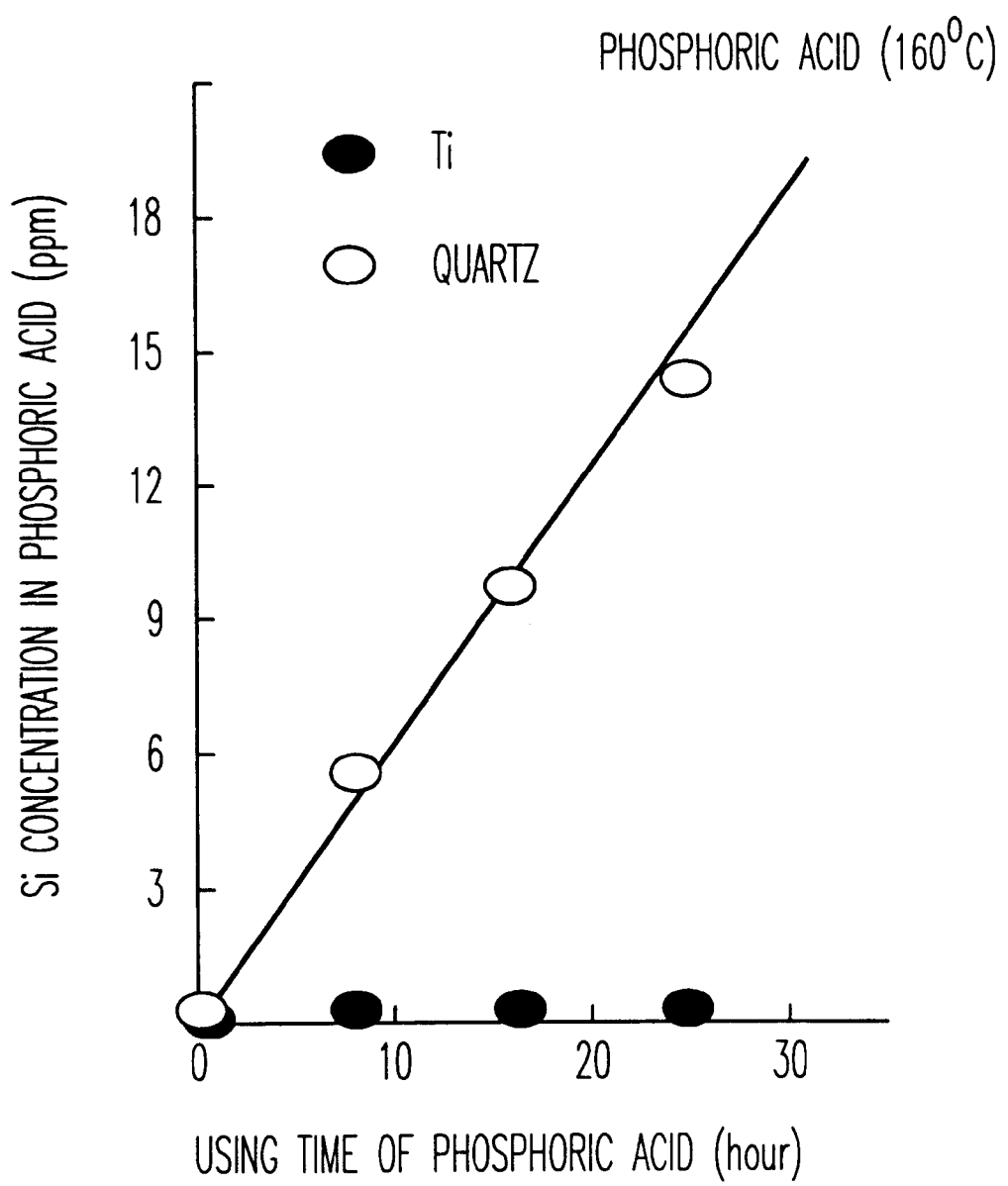
FIG. 11 is an illustration comparing increasing amounts of Si in phosphoric acid when a liquid contact portion is made of Ti or made of quartz.

The significance of a material contacting the treatment solution in a treatment tank or a circulation system in the system of the present invention shown in FIG. 4 is described below. In the case of the above embodiment, it is described that it is important to control Si concentration to a desired percentage of the Si saturation concentration at the specified temperature. Because the surfaces of a heater and a tank used at present are made of quartz, the amount of Si dissolved from the surface cannot be ignored. Though there have been cases in which SiC was used and quartz was avoided, Si is still contained in any case. FIG. 11 shows the increase rates of Si in phosphoric acid when the heater and tank are manufactured with Ti and when they are manufactured with conventional quartz parts. By manufacturing the system with Ti or its alloy or a material other than quartz, such as SUS316 or its electro-polished material, it is possible to reduce the bad influences of Si on etching rates. It is important for the present invention, which is a process using phosphoric acid at a high temperature by adding F, to constitute a treatment tank and a circulation system with a material from which Si does not dissolve.

Third Embodiment

Figure 12:
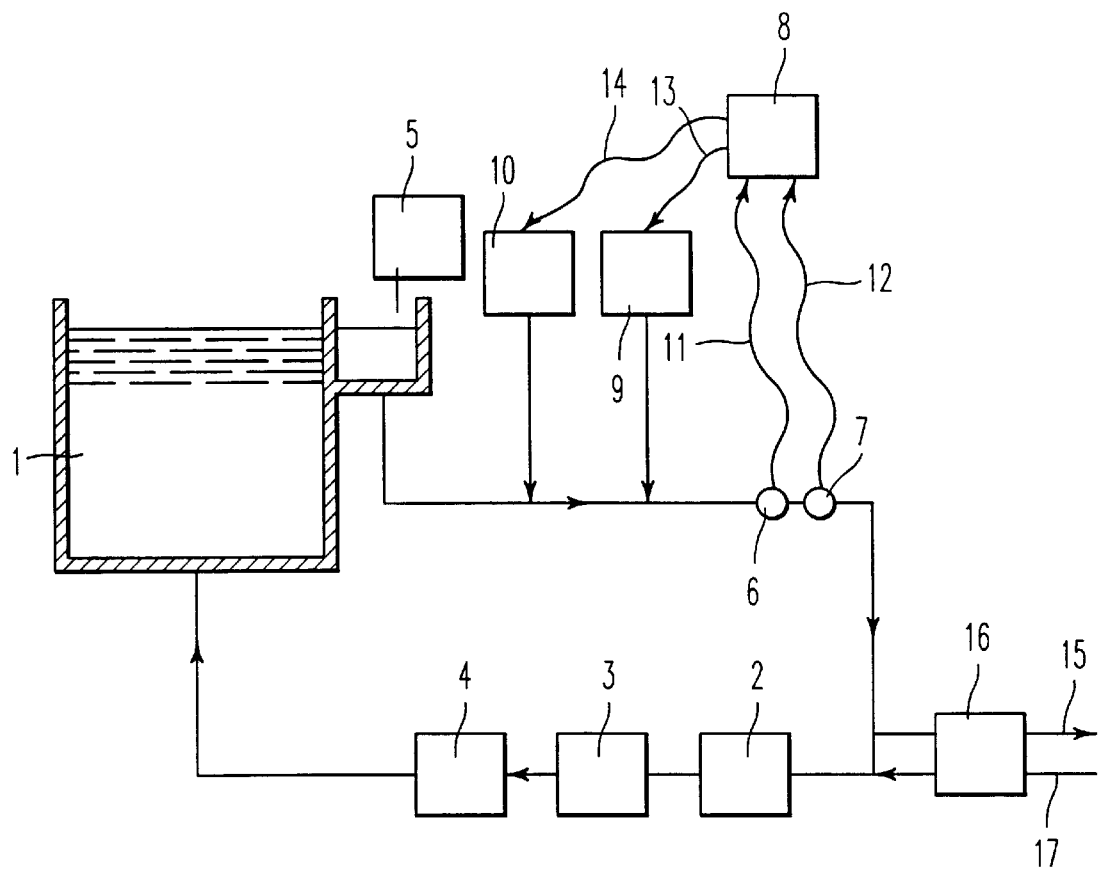
FIG. 12 is an illustration showing the configuration of the nitride film etching system (wet treatment system) according to the third embodiment of the present invention.

The third embodiment of the present invention stressing the discharge and injection of the treatment solution and adjustment of silicon concentration is described below. FIG. 12 illustrates a configuration of the etching system (wet treatment system) according to a third embodiment of the present invention. The wet treatment system comprises a treatment tank 1, a pump 2 for circulating the treatment solution through the tank 1, a filter 3 for removing impurities from the treatment solution, a heater 4 for returning the temperature of the treatment solution to treatment temperature, and a demineralized water dripping apparatus 5 for replenishing water to be evaporated.

The wet treatment system further comprises an Si concentration monitor 6 for sensing the Si concentration (silicon concentration) in the treatment solution and an F concentration monitor for sensing the F concentration (fluorine concentration) in the treatment solution. An injection control system 8 operates in accordance with signals of these monitors and controls an Si injector 9 for increasing the Si concentration in the treatment solution and an F injector 10 for increasing the F concentration in the treatment solution. Further, the information in the Si concentration monitor 6 is transferred to the injection control system 8 through a signal line 11, and the information in the F concentration monitor 7 is transferred to the injection control system 8 through a signal line 12. The injection control system 8 controls the Si injector 9 through a signal line 13 and the F injector 10 through a signal line 14. The above units and operations are the same as those of the system of the first embodiment in FIG. 1. Therefore, detailed description of them is omitted.

Furthermore, the wet treatment system of the third embodiment is constituted so that the treatment solution can be discharged from a part of a treatment solution circulation channel to drain 15 through a heat exchanger 16, and phosphoric acid can be added by a phosphoric acid addition pipe 17 through the heat exchanger 16.

In contrast, the second embodiment shown in FIG. 4 discharges Si-related impurities by adding F ions. In the case of the wet treatment system of the third embodiment shown in FIG. 12, however, the heat exchanger 16 is further set before the drain 15. Thus, a mechanism for discharging some of the phosphoric acid containing Si from the system is included in addition to the structure same as that of the second embodiment shown in FIG. 4, and phosphoric acid containing no impurities is supplied into the system so as to control the Si concentration in the system to a desired value or less. Moreover, heat from the phosphoric acid containing Si-related impurities is supplied to phosphoric acid containing no impurities by the heat exchanger 16.

Thus, the function of removing the Si-related impurity is added, and it is possible to keep the etching selection ratio between a nitride film serving as a film to be etched and another coexistent film (e.g. SioxNy-based film: $0 \leq x$, $y \leq 2$) constant for a long time. Moreover, the phosphoric acid exchange system according to this embodiment can be set to any position of the phosphoric acid circulation system and the amount of Si to be removed by F can be decreased.

Therefore, because the wet treatment system of the third embodiment is provided with a phosphoric acid exchange system in addition to the functions of the wet treatment system of the first embodiment in FIG. 1, it is possible to accurately control the Si concentration in the treatment solution, since the functions of the first and third embodiments are involved. Moreover, it is possible to independently apply the phosphoric acid exchange system according to circumstances.

In the case of the system in FIG. 12, the phosphoric acid solution to be discharged is cooled by phosphoric acid solution to be injected. However, if circumstances require, it is possible to cool the phosphoric acid solution to be discharged by water to be added to a treatment tank or circulation system. Furthermore, a case is permitted in which the phosphoric acid solution is cooled only by cooling water and the cooling water is discharged without bringing it into the circulation system. Furthermore, it is possible to add a cooling function by cooling water to the system in FIG. 12 in order to perform complete cooling.

Figure 13:
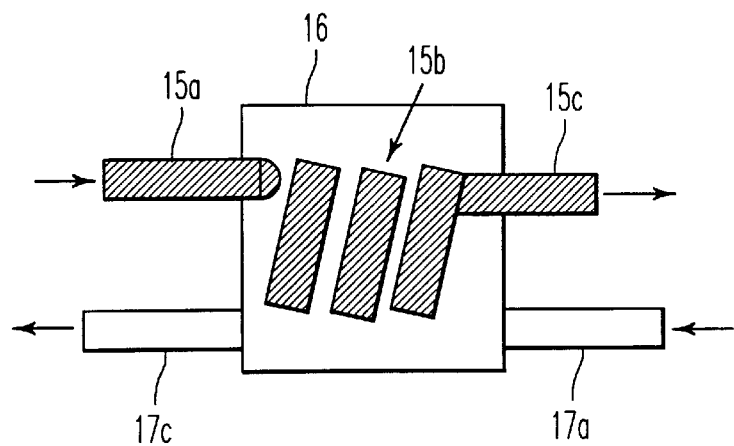
FIG. 13 is an illustration showing detailed construction of a heat exchanger.

The heat exchanger employed in the system of FIG. 12 is described below. FIG. 13 is an illustration showing the details of the heat exchanger of FIG. 12. The treatment solution at the treatment temperature is discharged into drain 15a to be heat-exchanged. The solution passes being heat-exchanged through drain 15b which runs through the heat exchanger 16 so that the specific surface area increases. The heat exchanger 16 is filled with normal-temperature treatment solution injected through a normal-temperature phosphoric acid addition pipe 17a. Therefore, the treatment solution in the drain 15b is completely cooled and discharged from heat-exchanged drain 15c.

The treatment solution thus heated is supplied into a treatment tank through a heated phosphoric acid addition pipe 17c. These liquid contact portions must be made of a metal with a high acid resistance and a high heat resistance, such as PVDF, PFA, or a metal free from metallic contamination.

The significance of adjusting the Si concentration in phosphoric acid to be added at the treatment temperature is described below. The Si concentration in the phosphoric acid increases as lots are treated. Though the Si concentration is effective to improve the selection ratio between $Si_3N_4$ and $SiO_2$, it has a disadvantage of decreasing the lifetime of the treatment solution. This is mainly because the system filter clogs.

Figure 14:
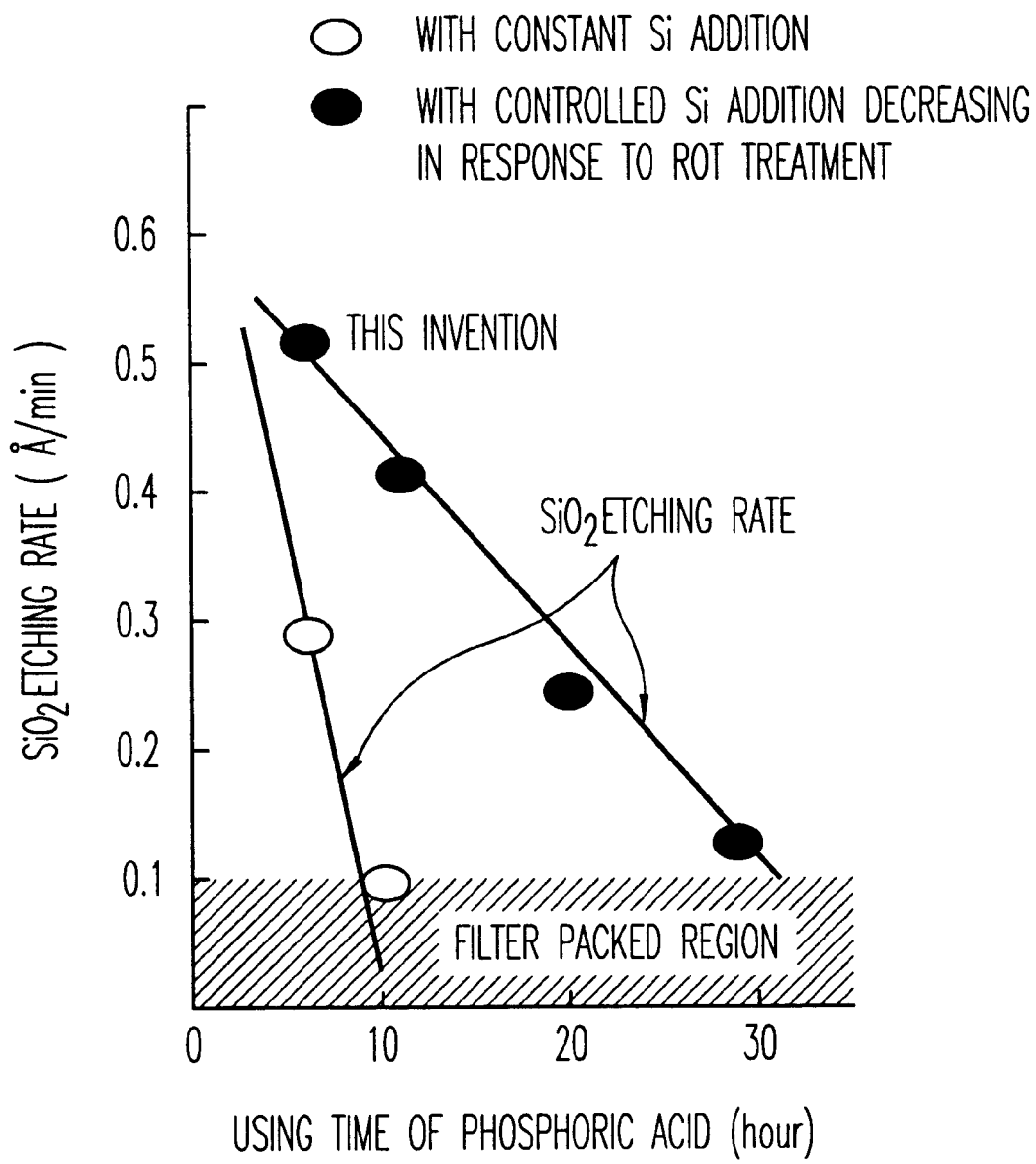
FIG. 14 is an illustration showing the relation between etching rate of $SiO_2$ and lifetime of the treatment solution when adjusting the concentration of Si injected into phosphoric acid and when quantitatively injecting Si into phosphoric acid.

Therefore, as described in the second embodiment, to control Si concentration to a control range of any rate of the Si saturation concentration at the treatment temperature, such as 25 to 90%, it is possible to increase the lifetime of the treatment solution by adjusting or slowly decreasing the Si concentration in phosphoric acid to be added as the treated number of lots increase. FIG. 14 shows the above case. As the result of adjustment, the lifetime of the treatment solution is increased up to three times. From this experiment result, the present inventor concluded that it is important not only to add Si to phosphoric acid but also to adjust the amount of Si. In this case, as described in the second embodiment, the lifetime of the treatment solution is further increased by adjusting F concentration, and it is possible to keep a selection ratio in the desired range for a longer time.

Fourth Embodiment

Figure 15:
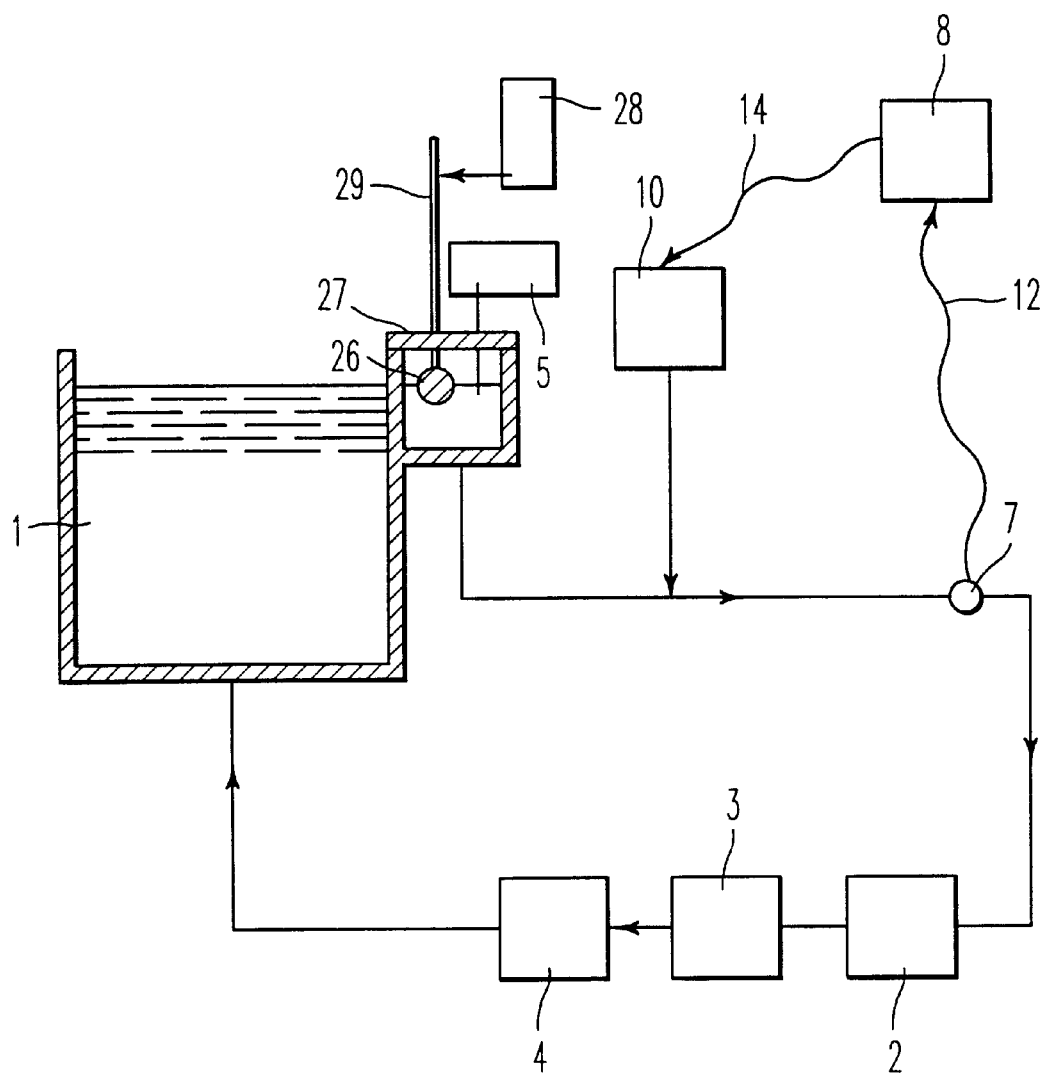
FIG. 15 is an illustration showing the configuration of the nitride film etching system (wet treatment system) according to the fourth embodiment of the present invention.

The fourth embodiment of the present invention is described below which stresses control of the specific gravity of the treatment solution and adjustment of the concentration of the treatment solution. FIG. 15 illustrates a configuration of the etching system (wet treatment system) according to a fourth embodiment of the present invention. The nitride-film etching system has a selection-ratio control function, and is capable of controlling the specific gravity of phosphoric acid to which F ions are added. The specific gravity of the treatment solution depends on its concentration and the density of contained substances, such as silicon. Therefore, control of the specific gravity of the phosphoric acid solution represents control of phosphoric acid concentration.

The system of the fourth embodiment shown in FIG. 15 is the same as the system of the first embodiment shown in FIG. 1 in the basic portion. In FIG. 15, the same symbol as that in FIG. 1 represents the same or an equivalent portion. Therefore, the detailed description of the portion is omitted. The system in FIG. 15 has a specific-gravity control function in addition to the F-ion concentration detection and F-ion addition functions described in FIG. 1. In the case of the system, steam containing $SiF_4$ or $H_2SiF_6$ evaporates and F ions are present in the phosphoric acid. Therefore, a float 26 having a surface with a high hydrofluoric-acid resistance, for example, made of PVDF or coated with PVDF is set to an overflow tank. Moreover, a cover 27 with hydrofluoric-acid resistance is set on the tank in order to separate it from a specific-gravity detector 28 set on the cover 27. Because the optical system of the specific gravity detector is located nearby a level rod 29 directly connected with the float 26, it is possible to optically check the specific gravity. In this case, when the substance to be injected is hydrofluoric acid, it is necessary to use a function for correcting the specific gravity of hydrofluoric acid, because the specific gravity is 1.13 compared to the specific gravity of water as 1.

Figure 16:
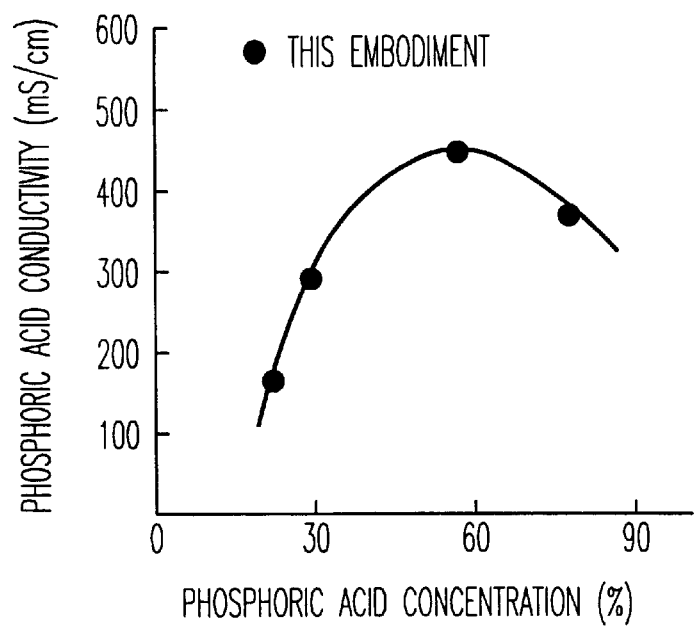
FIG. 16 is an illustration showing the relation between concentration and electric conductivity of phosphoric acid.

Moreover, specific gravity can be controlled by conductivity control as well as the densimeter shown in FIG. 15. Furthermore, it is possible to control the specific gravity by inserting a conductivity meter having hydrofluoric-acid resistance into treatment tank 1. FIG. 16 shows the relation between phosphoric acid concentration and conductivity. The relation in FIG. 16 can be directly applied in the case of phosphoric acid solution only. However, when an additive is added to the phosphoric acid, it is necessary to use the relation by shifting it up to a value equivalent to the influence of the phosphoric acid mixed with the additive.

As described above, in the case of the present invention, the wet treatment system using hot-phosphoric-acid is provided with a system for controlling the specific gravity of the treatment solution by measuring the specific gravity at an overflow section of the treatment solution or a downward section, and the diluted phosphoric acid or the water, or those containing F, is added to the treatment solution. Moreover, a system for measuring the specific gravity has a densimeter floated at a overflow section of the treatment solution or a downward section, and includes a unit capable of electrically, physically, or optically reading a value indicated by the densimeter.

Figure 17:
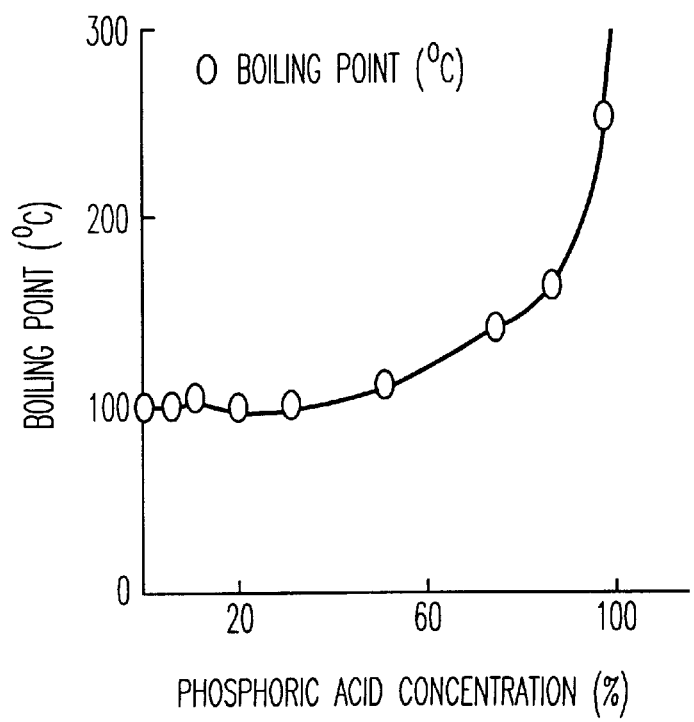
FIG. 17 is an illustration showing the relation between concentration and boiling point of phosphoric acid.
Figure 18:
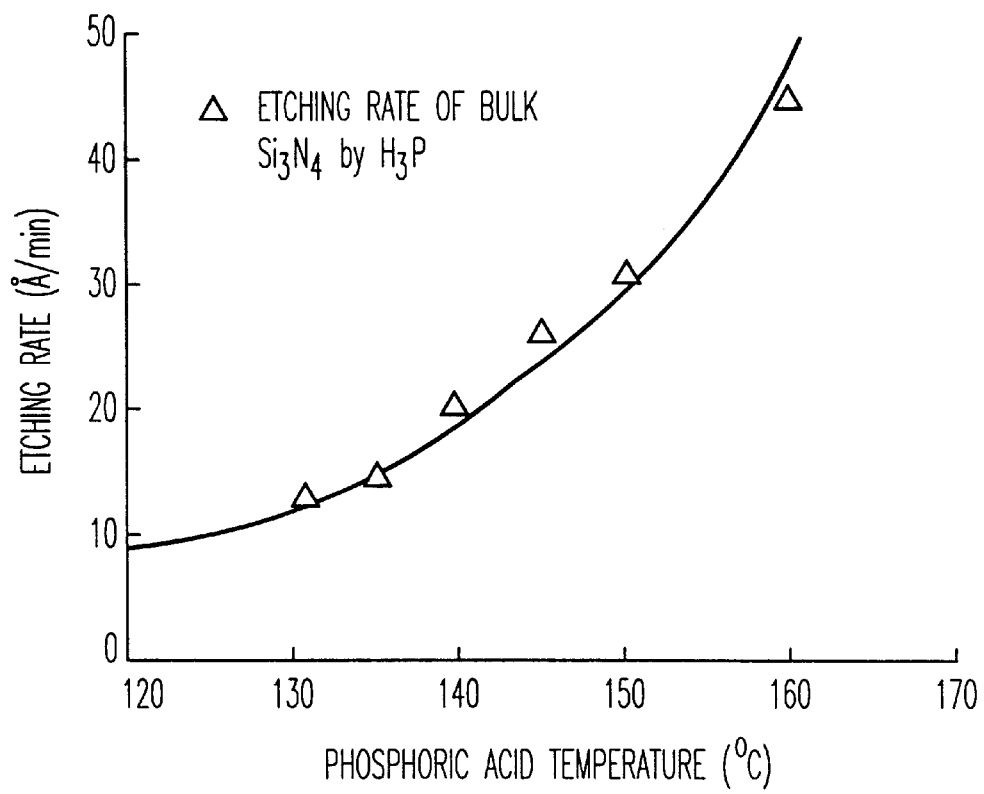
FIG. 18 is an illustration showing the relation between temperature and etching rate of phosphoric acid.
Figure 19:
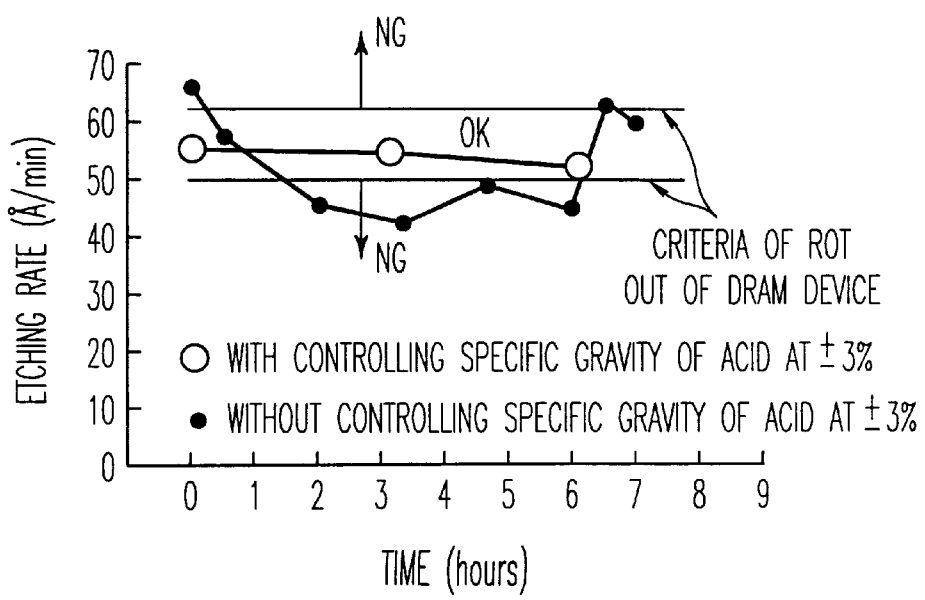
FIG. 19 is an illustration showing the results of experiments on the relation between presence or absence of specific gravity control and etching rate of phosphoric acid.

Moreover, as means for controlling the concentration of phosphoric acid, it is preferable that the specific gravity to be controlled is kept within ±3% of water saturated phosphoric acid at the treatment solution temperature. The reason is described below. First, it is described in the first embodiment by referring to FIG. 12 that it is necessary to control the accuracy of device manufacturing dimensions to at least ±10%. Then, the specific gravity of phosphoric acid corresponds to the concentration of the phosphoric acid one to one. The concentration also unequivocally determines the boiling point of the phosphoric acid. FIG. 17 is an illustration showing the correlation between the concentration and the boiling point of phosphoric acid. From FIG. 17, it is found that the boiling point ranges between ±5° C. or more widely when the phosphoric acid concentration ranges between ±3% at a treatment temperature of 160° C., frequently used for phosphoric acid treatment. FIG. 18 illustrates the correlation between phosphoric acid temperature and etching rate. From FIG. 18, it is found that the etching rate of an $Si_3N_4$ film between ±5° C. at a treatment temperature of 160° C. changes from 40 Å/min. to 50 Å/min. centering around 45 Å/min. Therefore, to meet the restriction of ±10% for device manufacturing, it is necessary to control the specific gravity within at least ±3%. FIG. 19 shows a graph of results of an experiment on whether an etching accuracy of ±10% can be satisfied when controlling the specific gravity of phosphoric acid at ±3% and when stopping the control of the specific gravity. In the case of the experiment controlling the phosphoric acid concentration within ±3%, the etching rate is 56±3 Å/min. and kept within ±10%. When performing no control within ±3%, however, it is found that the etching rate ranges between ±10% or more.

As described above, in the case of the present invention, the wet treatment system using hot-phosphoric-acid is provided with means for controlling the specific gravity by measuring the specific gravity of the treatment solution at an overflow section of the treatment solution or a downward section, and by adding water, diluted phosphoric acid, or the water or diluted phosphoric acid containing F to the treatment solution. Moreover, means for measuring the specific gravity has a densimeter floated at an overflow section of the treatment solution or a downward section, and includes a unit capable of electrically, physically, or optically reading a value indicated by the densimeter. Furthermore, the specific gravity of phosphoric acid is controlled so that the specific gravity is kept within ±3% of the specific gravity of water saturated phosphoric acid at the treatment solution temperature.

Fifth Embodiment

Figure 20:
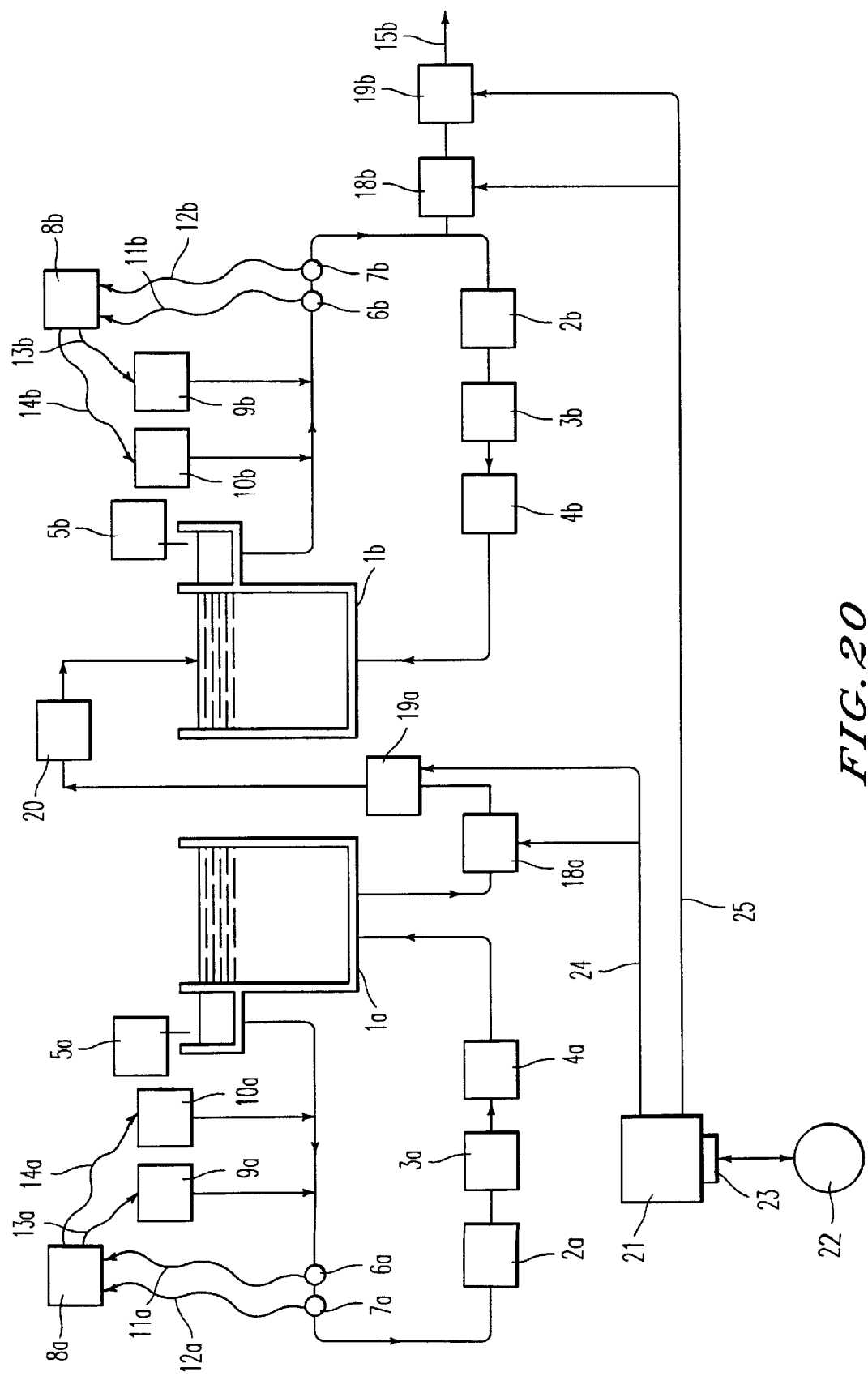
FIG. 20 is an illustration showing the configuration of the nitride film etching system (wet treatment system) according to the fifth embodiment of the present invention.
Figure 21:
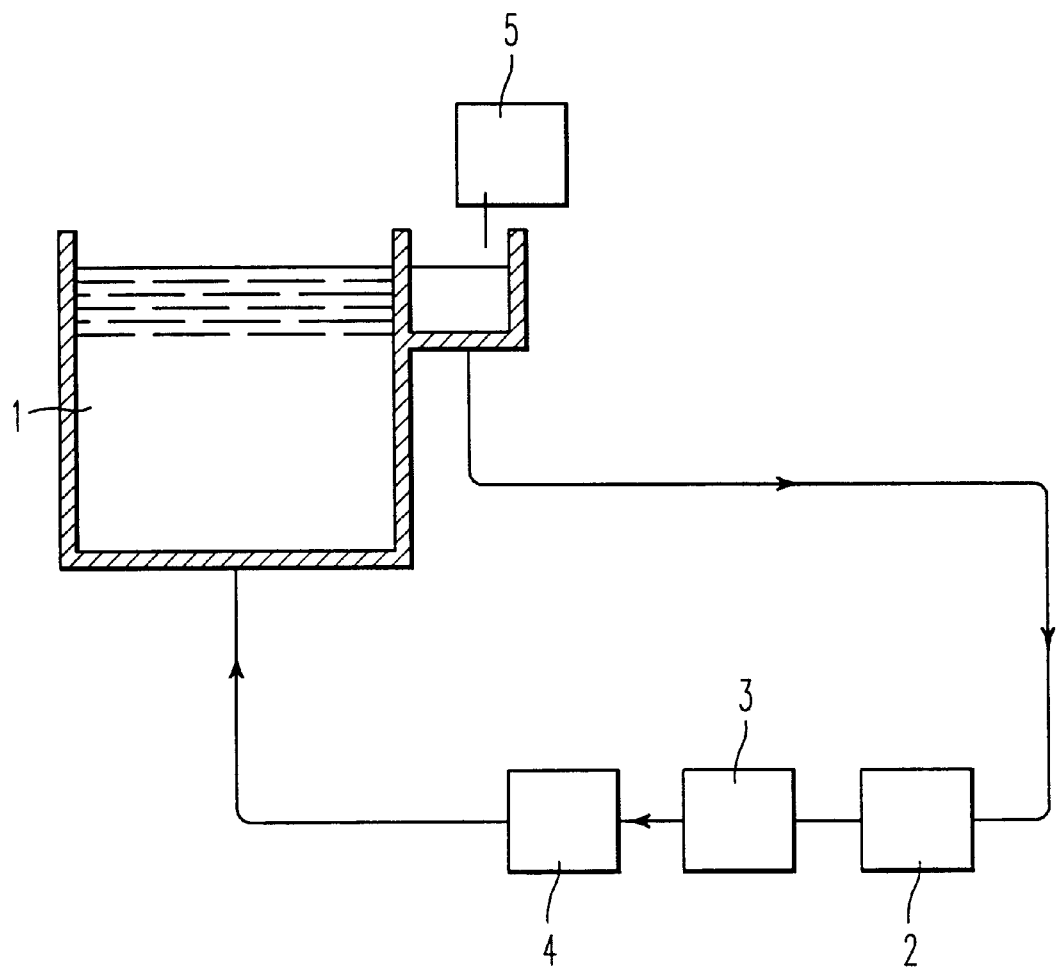
FIG. 21 is an illustration showing the configuration of a conventional nitride-film etching system (wet treatment system).

The fifth embodiment of the present invention is described below which stresses setting of a plurality of treatment tanks. FIG. 20 illustrates a configuration of the etching system (wet treatment system) according to the fifth embodiment of the present invention. As shown in FIG. 20, the wet treatment system is constituted by connecting the same system as the wet treatment system shown in FIG. 4 at two stages by assuming one system as treatment unit A and the other system as treatment unit B. In FIG. 20, a symbol same as that in FIG. 4 represents the same or an equivalent portion (except for the subscript 'a' or 'b'). Thus, the detailed description of these portions is provided above in the description of FIG. 4.

However, the wet treatment system of the fifth embodiment is provided with a treatment solution channel extended from a treatment tank 1a to a treatment tank 1b through a valve 18a, pump 19a, and silicon adjuster 20. Moreover, a channel is extended from the circulation channel of the treatment tank 1b to a drain 15b through a valve 18b and a pump 19b. Furthermore, a controller 21 is constituted so as to receive the information for a lot 22 through an interface 23, and controls the valve 18a, pump 19a, valve 18b, and pump 19b through control lines 24 and 25.

The wet treatment systems according to the first, second and third embodiments shown in FIGS. 1, 4, and 12 keep the etching selection ratio in each single tank constant. The wet treatment system of the fifth embodiment shown in FIG. 20 has a plurality of tanks. To simplify the description, however, the system of the fifth embodiment will be described using a system with two tanks.

The wet treatment system of the fifth embodiment performs treatment by Si-poor treatment solution and etching at a low selection rate in the treatment tank 1a of treatment unit A, and performs treatment by Si-rich treatment solution and etching at a high selection ratio in the treatment tank 1b of treatment unit B. For example, it is assumed that Si concentration is set to 0 to 70 ppm for treatment tank 1a and to 50 to 120 ppm for treatment tank 1b.

The system starts by using treatment solution in the treatment tank 1a. The Si concentration in the treatment tank 1a increases as wafer treatment advances. The increasing amount of Si concentration is calculated and estimated in accordance with the lot treatment data of lot 22 (e.g. history, treatment film thickness, number of wafers, and process). For example, the data of lot 22 is read into the controller 21 through the interface 23 to calculate the increasing amount of Si. When it is calculated that the Si concentration reaches the set value 70 ppm, the valve 18a is opened through the control line 24 to drive the pump 19a. Si-rich treatment solution is injected into the treatment tank 1b. Treatment tank 1b makes it possible to perform treatment using a treatment solution with a Si concentration of 70 ppm or more. Thus, SiOxNy etching at low and high selection ratios can be performed by one wet treatment system.

Moreover, the following operation can be performed. When the controller 21 determines that the treatment solution in the treatment tank 1b is out of the set condition as lot treatment advances, supply of a new lot to the treatment tank 1b is stopped. The treatment solution is discharged by opening the valve 18b to drive the pump 19b, and thereafter, water is supplied by closing the valve 18b. It is decided by the controller 21 whether the treatment solution in treatment tank 1a meets the desired condition. When the treatment solution meets the condition of a Si concentration of 50 ppm or more, the treatment solution is directly injected into the treatment tank 1b. This decision can also be made by the Si concentration monitor 6a. Even if the Si concentration does not reach the condition of 50 ppm, it is possible to adjust the concentration to the condition by adding Si by the Si adjuster 20 or Si injector 9b.

The phosphoric acid exchange means of this embodiment can be set to any position of a phosphoric acid circulation system, or can independently be used or can be combined with the F injection system, Si injection system, or the drain of the first to third embodiments.

Therefore, by using a plurality of tanks simultaneously, it is possible to limit the Si concentration in a tank to 50% or less of the saturation concentration at the desired temperature, and to limit the Si concentration in another tank to 50–90% of the Si concentration at the desired temperature, and selectively use low- or high-selection-ratio etching.

Although two treatment units (that is, two treatment tanks) are connected to each other in the case of FIG. 20, it is also possible to connect two or more necessary tanks to each other. In this case, treatment solution is transferred to a next-stage tank in series or properly transferred between treatment tanks. In the case of the example in FIG. 15, the treatment unit at each stage has the same configuration. However, it is also possible to use treatment units with different configurations. Moreover, it is possible to connect tanks with each other by a treatment solution channel (e.g. pipe) or transfer treatment solution between independent treatment units in batch.

The present invention is described above by way of the first through fifth embodiments respectively. However, these embodiments are mutually related. Therefore, the features of each embodiment can be properly combined, and a variety of etching systems can be realized in addition to each embodiment explicitly shown.

As described above, the present invention provides a silicon nitride film etching system which makes it possible to adjust and control the rate for etching a silicon nitride film and to perform stable etching, by adjusting or controlling the treatment solution mainly containing phosphoric acid used in the system. Moreover, the present invention provides an etching system with selection-ratio control capable of adjusting and controlling the etching selection ratio of films to be treated.

This application is based on Japanese Patent Application 8-81176, filed with the Japanese Patent Office on Apr. 3, 1996, the entire contents of which are hereby incorporated by reference.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A semiconductor nitride film etching system comprising:
   a treatment tank containing a treatment solution comprising heated phosphoric acid;
   means for circulating said treatment solution;
   means for adding ammonium fluoride or buffered hydrofluoric acid to said treatment solution, and
   means for detecting a fluorine concentration in said treatment solution to allow adjustment of said fluorine concentration by controlling an amount of fluorine to be added as ammonium fluoride or buffered hydrofluoric acid.

2. The semiconductor nitride film etching system according to claim 1, further comprising means for measuring specific gravity of said treatment solution to allow adjustment of the specific gravity of said treatment solution by adding water.

3. The semiconductor nitride film etching system according to claim 1, wherein said means for circulating said treatment solution comprises a circulation channel and wherein both of said treatment tank and a portion of said treatment solution circulation channel in contact with said treatment solution are made of a material from which no silicon dissolves under treatment and circulation conditions.

4. The semiconductor nitride film etching system according to claim 1, further comprising means for adding silicon or a silicon compound to said treatment solution.

5. The semiconductor nitride film etching system according to claim 1, further comprising means for cooling and discharging said treatment solution from said treatment tank and means for injecting new phosphoric acid solution into said treatment tank to allow adjustment of the components of said treatment solution in said tank.

6. A semiconductor nitride film etching system comprising:
   a treatment tank containing a treatment solution comprising heated phosphoric acid;
   means for circulating said treatment solution;
   means for adding silicon or a silicon compound to said treatment solution;
   means for detecting a silicon concentration in said treatment solution to allow adjustment of said silicon concentration by controlling an amount of silicon to be added; and
   means for adding fluorine to said treatment solution to allow adjustment of said silicon concentration in said treatment solution by controlling an amount of fluorine to be added.

7. The semiconductor nitride film etching system according to claim 6, further comprising means for adding fluorine to said treatment solution to allow adjustment of said silicon concentration in said treatment solution to a desired percentage of a silicon saturation concentration at the temperature of said treatment solution.

8. The semiconductor nitride film etching system according to claim 6, further comprising means for measuring specific gravity of said treatment solution to allow adjustment of the specific gravity of said treatment solution by adding water.

9. The semiconductor nitride film etching system according to claim 6, wherein said means for circulating said treatment solution comprises a circulation channel and wherein both of said treatment tank and a portion of said treatment solution circulation channel in contact with said treatment solution are made of a material from which no silicon dissolves under treatment and circulation conditions.

10. A semiconductor nitride film etching system according to claim 6, further comprising:
    means for cooling and discharging said treatment solution from said treatment tank; and
    means for injecting new phosphoric acid solution into said tank.

11. The semiconductor nitride film etching system according to claim 10, further comprising a heat exchanger for heat-exchanging said treatment solution to be discharged with phosphoric acid solution to be injected.

12. The semiconductor nitride film etching system according to claim 10, further comprising means for measuring specific gravity of said treatment solution to allow adjustment of the specific gravity of said treatment solution by adding water.

13. The semiconductor nitride film etching system according to claim 10, wherein said means for circulating said chemical solution comprises a circulation channel and wherein both of said treatment tank and a portion of said circulation channel in contact with said treatment solution are made of a material from which no silicon dissolves.

14. A semiconductor nitride film etching system comprising;

a plurality of treatment tanks containing a treatment solution comprising heated phosphoric acid and silicon;

means for circulating said treatment solution for each of said treatment tank;

means for adding silicon or a silicon compound to said treatment solution;

means for detecting a silicon concentration in said treatment solution to allow adjustment of said silicon concentration by controlling an amount of silicon to be added; and means for adding fluorine to said treatment solution to allow adjustment of said silicon concentration in said treatment solution by means for controlling an amount of fluorine to be added; and means for transferring said treatment solution between said plurality of treatment tanks;

wherein silicon concentration is controlled and adjusted during etching by transferring said treatment solution between members of said plurality of treatment tanks.

15. A semiconductor nitride film etching system comprising:

a plurality of treatment tanks containing a treatment solution comprising phosphoric acid and silicon;

means for transferring said treatment solution between said plurality of treatment tanks; and control means for calculating silicon concentration in said treatment solution in said treatment tanks and for controlling the transfer of said treatment solution between said treatment tanks, wherein silicon concentration is controlled and adjusted during etching by transferring said treatment solution between members of said plurality of treatment tanks.

* * * * *